(12) United States Patent
Win et al.

(10) Patent No.: US 8,721,900 B2
(45) Date of Patent: May 13, 2014

(54) SYSTEMATIC PACKAGING METHOD

(75) Inventors: Jux Win, Jebei (TW); Wei-Leun Fang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 12 days.

(21) Appl. No.: 13/619,293

(22) Filed: Sep. 14, 2012

(65) Prior Publication Data

US 2014/0021161 A1      Jan. 23, 2014

(30) Foreign Application Priority Data

Jul. 20, 2012   (TW) .............................. 101126148 A

(51) Int. Cl.
*H01B 13/00* (2006.01)

(52) U.S. Cl.
USPC ............................................................ 216/13

(58) Field of Classification Search
USPC .......................................................... 216/13
See application file for complete search history.

(56) References Cited

U.S. PATENT DOCUMENTS

| | | | | |
|---|---|---|---|---|
| 5,509,553 A | * | 4/1996 | Hunter et al. ................. | 216/13 |
| 5,629,563 A | * | 5/1997 | Takiar et al. ................. | 257/723 |
| 5,635,892 A | * | 6/1997 | Ashby et al. ................. | 336/200 |

* cited by examiner

*Primary Examiner* — Roberts Culbert
(74) *Attorney, Agent, or Firm* — Birch, Stewart, Kolasch & Birch, LLP

(57) ABSTRACT

A systematic packaging method, comprises providing a package, said package operable for packaging an object; and spreading and plating one or more conductive structures on said package; wherein said spreading and plating steps are performed by the methods selected from the group consisting of physically, chemistry deposit and selectively etching.

16 Claims, 2 Drawing Sheets

SYSTEMATIC PACKAGING METHOD

TECHNICAL FIELD

The present invention relates to a packaging method, more especially a systematic packaging method for an inertial sensing device.

BACKGROUND

With the continuous development of integrated circuit technology, electronic products are increasingly miniaturized, intelligent, high-performance and high reliability. The package of the integrated circuit not only direct affect the performance of the integrated circuit itself, the electronic module, and even the whole machine, but also restricts the miniaturization, the cost and the reliability of electronic systems. Since the chip size of the integrated circuit is gradually minimize and the integration ability is increasing, the requirement of the IC packaging technology for the electronic industry is harsher. However, since the currently system on a chip of the micro-electromechanical system has active components inside the chip, the closest standard method of the packaging is to insert a glass film which is so called glass fit bonding. The conventional glass film is used to protect the cover of the die of the IC. The normal molding material is used for isolation (such as, contact protection, vapor isolation, and air isolation), the functionality is less but the cost is high. Moreover, the glass film has the disadvantage of the deformation which comes from the mechanical or thermal stress so as to impact the performance of the micro-electromechanical system.

SUMMARY

One of the purposes of the invention is to provide a systematic packaging method for a single-material mass proof. The disclosed systematic packaging method enhances the design flexibility of the inertial sensing device which performance adjustable. So as to reduce the cost and the range of the applicable area of the inertial sensing device which formed by the disclosed packaging method is wide.

One of the purposes of the invention is to disclose a systematic packaging method, wherein the method provides a package and a conductive structure and directly form the conductive structure on the surface of the package.

For example, the package can be such as a glass substrate or a macromolecule molding material which can be patterned, but not limited to. The glass substrate can be such as a plastic with the macromolecule material or a glass plate with a macromolecule bottom layer, but not limited to.

The material of the conductive structure of the surface of the package is metal, alloy or any conductive material. And the conductive structure can be patterned as any type to form an electrode or a passive component. The conductive structure can be any shape and the length of the conductive structure is adjustable. The passive component formed by the conductive structure includes a capacitor, an inductor, and a resistor to integrate the function of the System On a Chip.

One of the purposes of the invention is to disclose a systematic packaging method, the method includes spreading and plating one or more conductive structures on said package, wherein said spreading and plating steps are performed by the methods selected from the group consisting of physically, chemistry deposit and selectively etching, so as to pattern the conductive structure.

The conductive structure of the package can be patterned as a wire to connect an object (such as a die in an IC). The package can be electrically connected to the object via the wire.

A high dielectric material is buried inside the package to form a capacitor, and/or the spiral conductor according to a mutual inductance principle to form an inductor. Or, the package 1 can includes a capacitor or an inductor formed by patterning the conductive structure directly.

The resistors in the package are buried inside the package and formed by burring the conductive structure or resistive elements with different conductance characteristics. The resistors are buried in said package and form as a plurality of resistors with different resistances.

A distance is exist between the electrode of the package and the object in order to obtain different sensing or driving sensitivity.

The package can be patterned partially or completely, thereby forming regional shading, filtering or antenna function.

The distance between the package and the conductive structure is adjustable by modulate the depth of the metal of a plating layer or by patterning the package, so as to modulate the performance of sensing and driving.

The present invention is suitable for any system package area, such as optical, inertial motion, touch, particulate, chemical and biological molecules area which can be converted to the electrical sensing or electrical driving system.

A single-material mass proof can perform multi degree-of-freedom inertial sensing device. The inertial sensor prevents any deformation comes from the mechanical or thermal stress, and multi-electrode design makes this structure achieve multi degree-of-freedom inertial sensing, including accelerometers and gyroscopes. By means of adjusting the matrix of the same micro-structure arrays, it can result in corresponding performance specifications. Furthermore, this design can be easily fulfilled in the standard semiconductor technologies to integrate the processing circuits for a system-on-a-chip (SoC).

Therefore, this invention effectively increases the design flexibility of inertial sensing devices, lower the manufacturing cost, and the adoption for more kinds of products.

BRIEF DESCRIPTION OF THE DRAWINGS

Features and advantages of embodiments of the subject matter will become apparent as the following detailed description proceeds, and upon reference to the drawings, wherein like numerals depict like parts, and in which.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
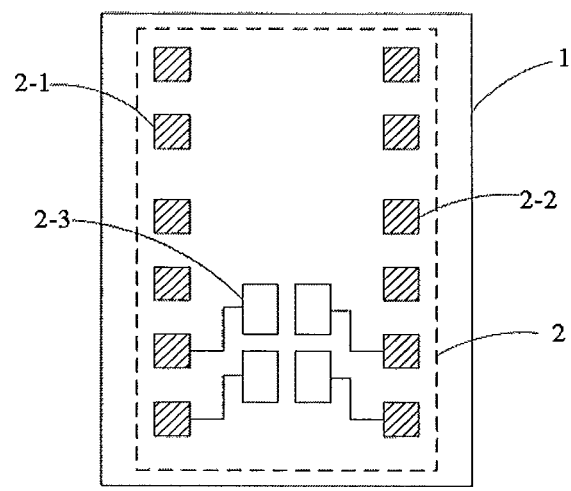
FIG. 1 illustrates a package structure of a chip in accordance with one embodiment of the present invention.

FIG. 1 illustrates a package structure of a chip in accordance with one embodiment of the present invention. The present invention provides a package 1 and a conductive structure 2. The conductive structure 2 is formed on the package 1 directly.

In the embodiment, the package 1 is packaging an object. In a prefer embodiment, the package 1 can be a glass substrate or a macromolecule packaging material. The object is a die of the IC shown in FIG. 2.

Figure 2:
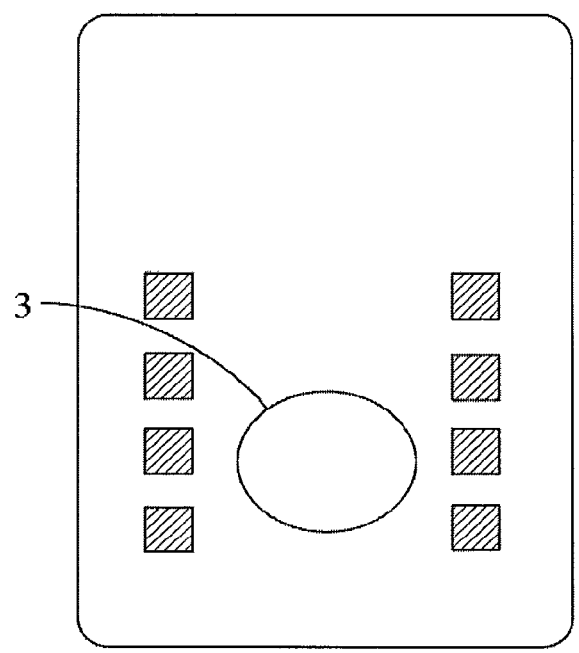
FIG. 2 illustrates a structure of a die of an IC in accordance with one embodiment of the present invention.

FIG. 2 illustrates a structure of a die of an IC in accordance with one embodiment of the present invention. An electrode 3 is configured on the die of the IC. The package 1 can be patterned and the glass substrate. The glass substrate can be such as a plastic with the macromolecule material or a glass plate with a macromolecule bottom layer, but not limited to.

The material of the conductive structure 2 of the surface of the package 1 is metal, alloy or any conductive material. And the conductive structure 2 can be patterned as any type to form an electrode 3 or a passive component. The conductive structure 2 can be any shape and the length of the conductive structure 2 is adjustable. The passive component formed by the conductive structure 2 includes a capacitor, an inductor, and a resistor to integrate the function of the System On a Chip.

The packaging method of the present invention is to spread and plate one or more conductive structures 2 on the package 1, wherein the spread and plate steps are performed by the methods selected from the group consisting of physically, chemistry deposit and selectively etching, so as to pattern the conductive structure 2 and further to form as an electrode 3, wire, and/or functional components. The electrode 3 and/or the wire are connected to the sensing electrode of the inner structure of the package 1. The sensing electrode of the inner structure of the package 1 has the function of a capacitor, thermal, or chemical composition. The electrode 3 and/or the wire can be a part of the design to act as a conductive wires or a radiating channel (low thermal resistor).

The electrode 3 and the wire can cooperate with the packaging structure by the array or matrix arrangement and can be any shape of combination.

More particular, the distance between the package 1 and the conductive structure 2 is adjustable by adjusting the depth of a metal of a plating layer or by patterning the package 1, so as to enhance an efficiency of sensing and driving. The wire can cooperate with the wire pad (includes solder ball) of the package 1 to connect with the conductive ball so as to electrically connect with the bottom circuit.

In the package 1, a high dielectric material is buried inside the package 1 to form a capacitor, and/or the spiral conductor according to a mutual inductance principle to form an inductor. Or, the package 1 can includes a capacitor or an inductor formed by patterning the conductive structure 2 directly.

The resistors in the package 1 are buried inside the package 1 and formed by burring the conductive structure 2 or resistive elements with different conductance characteristics. The resistors are buried in said package and form as a plurality of resistors with different resistances.

In one embodiment, the present invention includes a package 1 and a conductive structure 2. The conductive structure 2 is configured on the package 1 and is patterned to form a plurality of electrodes 2-1, 2-2, and 2-3. The electrode 2-1 can combine with the printed circuit board (PCB) or the other die and directly form the wire with any shape between the electrodes 2-2 and 2-3 by patterning the conductive structure 2. The electrodes 2-2 can combine with the die shown in FIG. 2, and the electrodes 2-3

The present invention is suitable for any system package area, such as optical, inertial motion, touch, particulate, chemical and biological molecules area which can be converted to the electrical sensing or electrical driving system.

The present invention can apply on a single-material mass proof can perform multi degree-of-freedom inertial sensing device. The inertial sensor prevents any deformation comes from the mechanical or thermal stress, and multi-electrode design makes this structure achieve multi degree-of-freedom inertial sensing, including accelerometers and gyroscopes.

By means of adjusting the matrix of the same micro-structure arrays, it can result in corresponding performance specifications. Furthermore, this design can be easily fulfilled in the standard semiconductor technologies to integrate the processing circuits for a system-on-a-chip (SoC).

Therefore, this invention effectively increases the design flexibility of inertial sensing devices, lower the manufacturing cost, and the adoption for more kinds of products.

While the foregoing description and drawings represent embodiments of the present invention, it will be understood that various additions, modifications and substitutions may be made therein without departing from the spirit and scope of the principles of the present invention. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, and not limited to the foregoing description.

What is claimed is:

1. A systematic packaging method, comprising:
   providing a package, said package operable for packaging an object; and
   spreading and plating one or more conductive structures on said package;
   wherein said spreading and plating steps are performed by the methods selected from the group consisting of physically, chemistry deposit and selectively etching, and
   wherein said package is patterned to achieve the functions of filtering, antenna, and regional shading.

2. The method as claimed in claim 1, further comprising:
   selectively etching said one or more conductive structures so as to patterning said one or more conductive structures as an electrode.

3. The method as claimed in claim 1, further comprising:
   selectively etching said one or more conductive structures so as to patterning said one or more conductive structures as a passive component.

4. The method as claimed in claim 1, further comprising:
   selectively etching said one or more conductive structures so as to patterning said one or more conductive structures as a wire.

5. The method as claimed in claim 1, wherein said package comprises a capacitor formed by a high dielectric material.

6. The method as claimed in claim 1, wherein said package comprises an inductor formed by a spiral conductor.

7. The method as claimed in claim 1, wherein said package comprises a plurality of resistive elements with different conductance characteristics, and wherein said resistors are buried in said package and form as a plurality of resistors with different resistances.

8. The method as claimed in claim 1, wherein a distance between said package and said one or more conductive structures can be modulated by adjusting a depth of a metal of a plating layer and by patterning said package, so as to enhance an efficiency of sensing and driving.

9. A systematic packaging method, comprising:
providing a package, said package operable for packaging an object; and
spreading and plating one or more conductive structures on said package;
wherein said spreading and plating steps are performed by the methods selected from the group consisting of physically, chemistry deposit and selectively etching,
wherein said package comprises a glass substrate and macromolecule components, and wherein said package comprises patterns, and
wherein said package is patterned to achieve the functions of filtering, antenna, and regional shading.

10. The method as claimed in claim 9, further comprising: selectively etching said one or more conductive structures so as to patterning said one or more conductive structures as an electrode.

11. The method as claimed in claim 9, further comprising: selectively etching said one or more conductive structures so as to patterning said one or more conductive structures as a passive component.

12. The method as claimed in claim 9, further comprising: selectively etching said one or more conductive structures so as to patterning said one or more conductive structures as a wire.

13. The method as claimed in claim 9, wherein said package comprises a capacitor formed by a high dielectric material.

14. The method as claimed in claim 9, wherein said package comprises an inductor formed by a spiral conductor.

15. The method as claimed in claim 9, wherein said package comprises a plurality of resistive elements with different conductance characteristics, and wherein said resistors are buried in said package and form as a plurality of resistors with different resistances.

16. The method as claimed in claim 9, wherein a distance between said package and said one or more conductive structures can be modulated by adjusting a depth of a metal of a plating layer and by patterning said package, so as to enhance an efficiency of sensing and driving.

* * * * *